United States Patent [19]

Kim

[11] Patent Number: 5,895,251
[45] Date of Patent: Apr. 20, 1999

[54] METHOD FOR FORMING A TRIPLE-WELL IN A SEMICONDUCTOR DEVICE

[75] Inventor: Wan-Soo Kim, Chungcheongbuk-do, Rep. of Korea

[73] Assignee: LG Semicon Co., Ltd., Chungcheongbuk-do, Rep. of Korea

[21] Appl. No.: 08/802,255

[22] Filed: Feb. 19, 1997

[30] Foreign Application Priority Data

May 2, 1996 [KR] Rep. of Korea .................. 96-14163

[51] Int. Cl.$^6$ .................................................. H01L 21/76
[52] U.S. Cl. .......................................... 438/401; 438/420
[58] Field of Search .................................. 438/420, 210, 438/527, 241, 401

[56] References Cited

U.S. PATENT DOCUMENTS

| | | | |
|---|---|---|---|
| 4,155,777 | 5/1979 | Dunkley et al. | 438/527 |
| 4,332,627 | 6/1982 | Schmitt et al. | 438/527 |
| 4,456,488 | 6/1984 | Gahle | 438/527 |
| 4,931,406 | 6/1990 | Tomioka | 438/420 |
| 5,118,631 | 6/1992 | Dyck et al. | 438/527 |
| 5,145,794 | 9/1992 | Kase et al. | 438/527 |
| 5,238,860 | 8/1993 | Sawada et al. | 438/241 |
| 5,286,991 | 2/1994 | Hui et al. | 438/210 |
| 5,292,671 | 3/1994 | Odanaka . | |
| 5,397,734 | 3/1995 | Iguchi et al. | 438/527 |
| 5,460,984 | 10/1995 | Yoshida | 438/401 |
| 5,501,993 | 3/1996 | Borland | 437/34 |
| 5,595,925 | 1/1997 | Chen et al. | 438/210 |

OTHER PUBLICATIONS

Wolf, Stanley "Silicon Processing For the VLSI Era vol. 1: Process Technology", Lattice Press, p. 125, 1986.
Wolf, Stanley "Silicon Processing For the VLSI Era vol. 2: Process Integration", Lattice Press, pp. 482–500, 534–551, 1990.

*Primary Examiner*—John F. Niebling
*Assistant Examiner*—Michael S. Lebentritt

[57] ABSTRACT

A method of forming a triple-well in a semiconductor device, includes the steps of forming a second conductivity type impurity region in a first conductivity type semiconductor substrate, forming an epitaxial layer on the semiconductor substrate, forming a second conductivity type first well in a first portion of the epitaxial layer, and a second conductivity type second well in a second portion of the epitaxial layer, and forming a first conductivity type first well in the first portion of the epitaxial layer, and a first conductivity type second well in a portion of the epitaxial layer between the second conductivity type first and second wells.

23 Claims, 4 Drawing Sheets

METHOD FOR FORMING A TRIPLE-WELL IN A SEMICONDUCTOR DEVICE

BACKGROUND OF THE INVENTION

The present invention relates to a method for forming a triple-well in a semiconductor device, and more particularly, to a method for forming a triple-well, which is suitable for simplifying the fabrication process of the semiconductor device and for increasing its integration.

In fabricating a semiconductor device, it is sometimes required that a plurality of wells are formed in a semiconductor substrate in various forms. That is, the formation of a triple-well is often required in a semiconductor substrate.

FIGS. 1A to 1E are cross-sectional views for explaining a conventional method of forming a triple-well in a semiconductor substrate.

Referring to Fig. 1A, a photoresist mask 2 is formed on a semiconductor substrate 1 through photolithography, and n-type ions such as phosphorus P are ion-implanted (3) into the substrate 1 with a high energy using the photoresist mask 2. As a result, an n-shield region 4 is formed in the substrate 1.

Referring to FIG. 1B, the photoresist mask 2 is removed and photolithography is carried out to form a photoresist mask 5 defining a certain portion of the substrate, which is narrower than the n-shield region 4. Thereafter, p-type ions such as boron B are ion-implanted (6) into the substrate 1 using the photoresist mask 5 to form a p-well 7 in the n-shield region 4.

Referring to FIG. 1C, the photoresist mask 5 is removed and then a photoresist mask 8 is formed through photolithography, which exposes a portion of the substrate 1 away from the p-well 7. N-type ions such as phosphorus P are then ion-implanted (9) into the substrate 1 using the photoresist mask 8 to form an n-well 10 separate from the p-well 7 in the substrate 1.

Referring to FIG. 1D, the photoresist mask 8 is removed and a photoresist mask 11 is formed through photolithography, which exposes a portion of the substrate 1 between the p-well 7 and the n-well 10 and a portion of the substrate 1 adjacent to the p-well 7. P-type ions such as boron B are then ion-implanted (12) into the substrate 1 using the photoresist mask 11 to form a p-well 13. Then, diffusion and annealing processes are carried out through heat treatment, and a triple-well as shown in Fig. 1E is formed in the semiconductor device.

As described above, in the conventional method for forming a triple-well, a high-energy ion implantation is carried out to form a deep n-shield region. This generates many defects in the semiconductor substrate, deteriorating the characteristic of the semiconductor device. Also, since the junction depth of the n-well and n-shield region are different from each other, it is required that the n-well and n-shield region be formed through separate ion implantation. This complicates the fabrication process.

SUMMARY OF THE INVENTION

It is an object of the present invention to provide a method of forming a triple-well in a semiconductor substrate of a semiconductor device, which overcomes above and other problems of the conventional method.

It is another object of the present invention to provide a method for forming a triple-well without using high-energy ion implantation.

To accomplish the above objects of the present invention, there is provided a method for forming a triple-well in a semiconductor device, including the steps of selectively forming a second conductivity type impurity region in a first conductivity type semiconductor substrate; forming an epitaxial layer on the substrate and on the second conductivity type impurity region; forming a second conductivity type first well in a portion of the epitaxial layer corresponding to the second conductivity type impurity region and, at the same time, forming a second conductivity type second well in a portion of the epitaxial layer, wherein the second conductivity type second well is separated from the second conductivity type first well; and forming a first conductivity type first well in the second conductivity type first well located in the epitaxial layer and, at the same time, forming a first conductivity type second well in a portion of the epitaxial layer between the second conductivity type first and second wells.

The first conductivity type is an n-type and the second conductivity type is a p-type. But the conductivity can be switched so that the first conductivity type is a p-type and the second conductivity type is an n-type. It is also preferable that the impurity region and wells are formed through ion implantation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a method of forming a triple-well in a semiconductor device, including the steps of forming a shield region of a first conductivity type in a substrate; forming first and second wells of a firs conductivity type in the substrate; and forming third and fourth wells of a second conductivity type in the substrate so that the shield region contacts the first well.

Furthermore, the present invention is directed to a method of forming a triple-well in a semiconductor device, including the steps of forming a second conductivity type impurity region in a first conductivity type semiconductor substrate; forming an epitaxial layer on the semiconductor substrate; forming a second conductivity type first well in a first portion of the epitaxial layer, and a second conductivity type second well in a second portion of the epitaxial layer; and forming a first conductivity type first well in the first portion of the epitaxial layer, and a first conductivity type second well in a portion of the epitaxial layer between the second conductivity type first and second wells.

Moreover, the present invention is directed to a method for forming a triple-well in a semiconductor device, including the steps of forming a first mask pattern on a portion of a first conductivity type semiconductor substrate, and ion-implanting second conductivity type impurity ions using the first mask pattern to form a second conductivity type impurity region; removing the first mask pattern and forming an epitaxial layer of a first conductivity type material on the semiconductor substrate; forming a second mask pattern on the epitaxial layer, performing ion-implantation of second conductivity type impurity ions using the second mask pattern, applying heat thereto to form second conductivity type first and second wells, and removing the second mask pattern, whereby the second conductivity type first well is formed on the second conductivity type impurity region; and forming a third mask pattern on the epitaxial layer and

3 ion-implanting first conductivity type impurity ions into the epitaxial layer using the third mask pattern to form first conductivity type first and second wells, whereby the first conductivity type first well is surrounded by the second conductivity type first well, and the first conductivity type second well is formed between the second conductivity type first and second wells.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein:

FIGS. 1A to 1E are cross-sectional views for explaining a conventional method of forming a triple-well; and FIGS. 2A to 2F are cross-sectional views for explaining a method for forming a triple-well in a semiconductor device according to the embodiments of the present invention.

DETAILED DESCRIPTION OF PREFERRED EMBODIMENTS

A preferred embodiment of the present invention will be explained below with reference to the accompanying drawings.

FIGS. 2A to 2F are cross-sectional views showing a method of forming a triple-well in a semiconductor device according to the present invention.

Figure 1A:
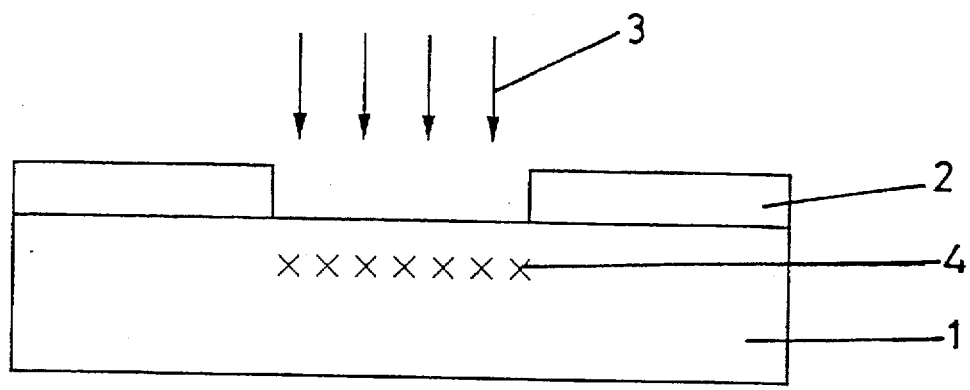
Figure 1B:
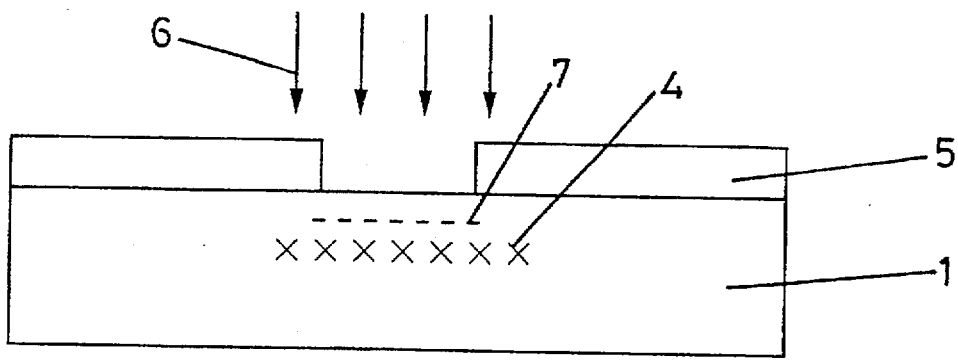
Figure 1C:
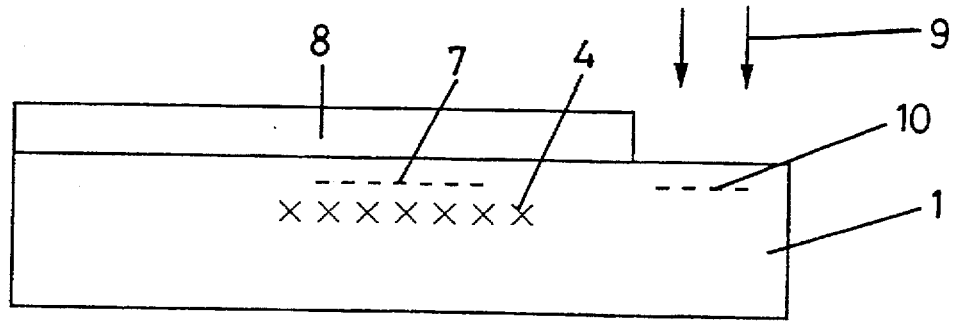
Figure 1D:
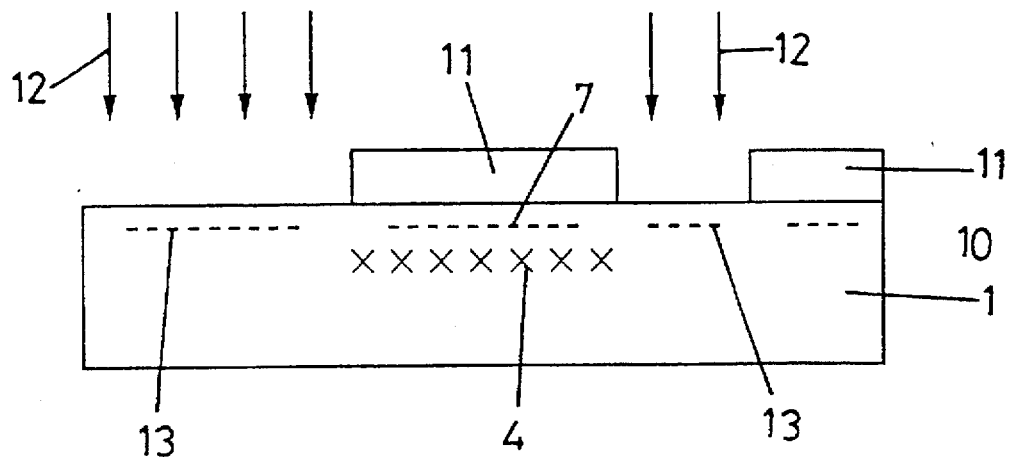
Figure 1E:
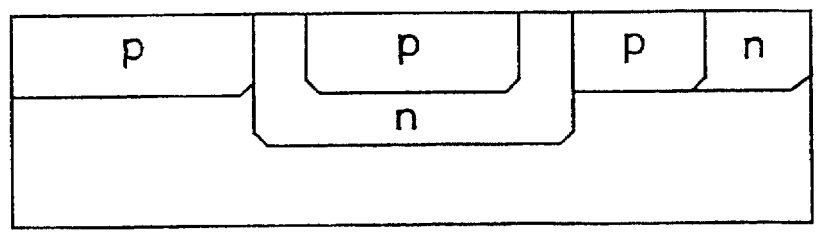
Figure 2A:
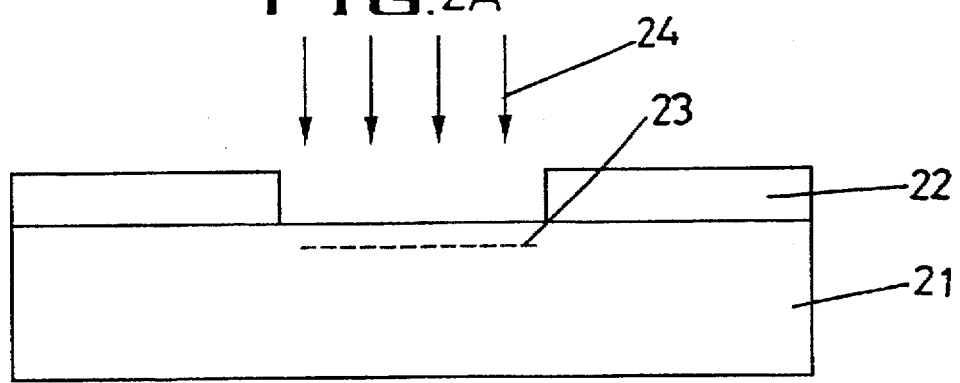

Referring to FIG. 2A, an oxide layer 22 is formed on a first conductivity type semiconductor substrate 21, for example, a p-type silicon substrate. A portion of the oxide layer 22 is selectively removed through photolithography to expose a portion of the substrate 21 in which an n-shield region will be formed. Then, second conductive type (e.g., n-type) impurity ions such phosphorus P are ion-implanted (24) into the substrate 21.

Figure 2B:
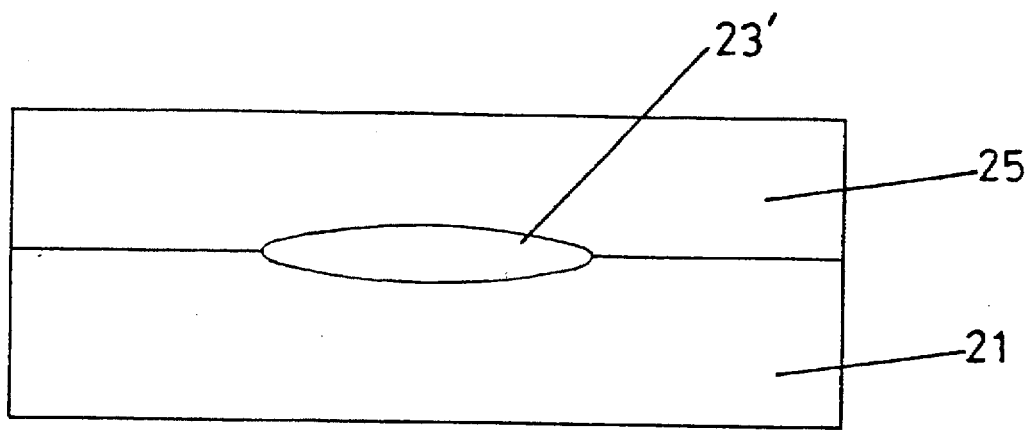

Referring to FIG. 2B, the oxide layer 22 is removed and an epitaxial layer 25 is grown on the substrate 21. Here, the implanted impurity ions are diffused to form a diffusion region, i.e., a second conductivity type impurity region 23'.

Figure 2C:
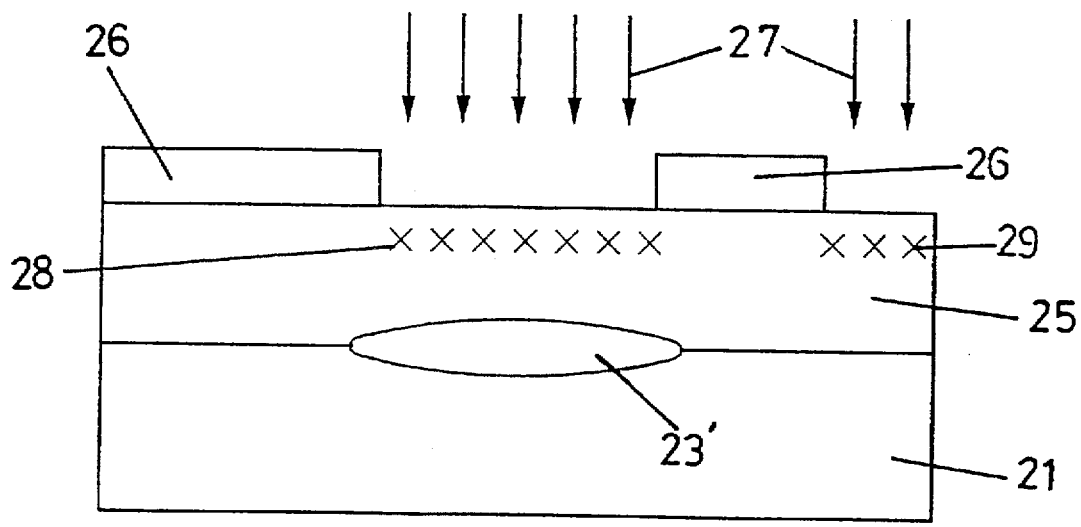
Figure 2D:
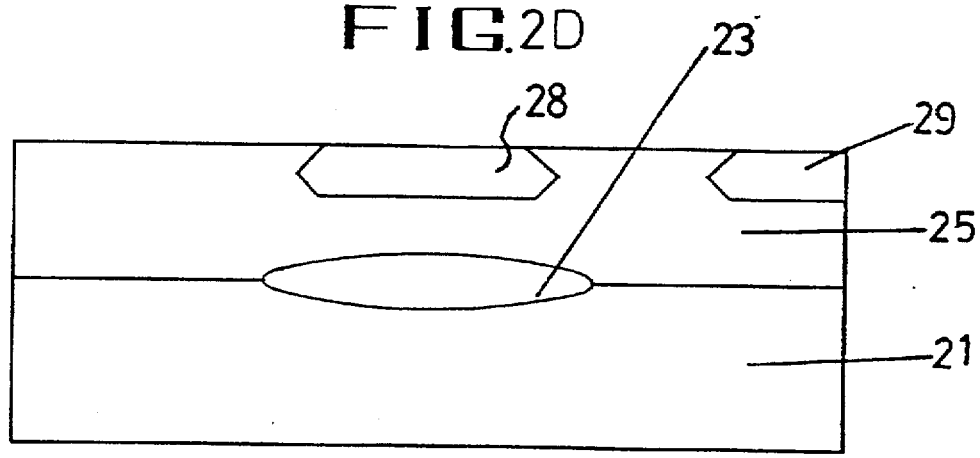

Referring to FIG. 2C, a photoresist mask 26 is formed on the epitaxial layer 25, which exposes a portion of the epitaxial layer 25 in which an n-shield region and n-well region will be formed. Then, n-type ions such as phosphorus P are ion-implanted (27) using the photoresist mask 26. Then a heat treatment is carried out to thereby simultaneously form second conductivity type (n-type) first and second wells 28 and 29 as shown in FIG. 2D. The first well 28 functions as the n-shield region. Here, ion implantation (27) is carried out to a predetermined depth so that the diffusion region 23' can contact the first well 28 when the heat treatment (to be applied later) for forming a p-well is finished The process of forming p-wells is described below.

Figure 2E:
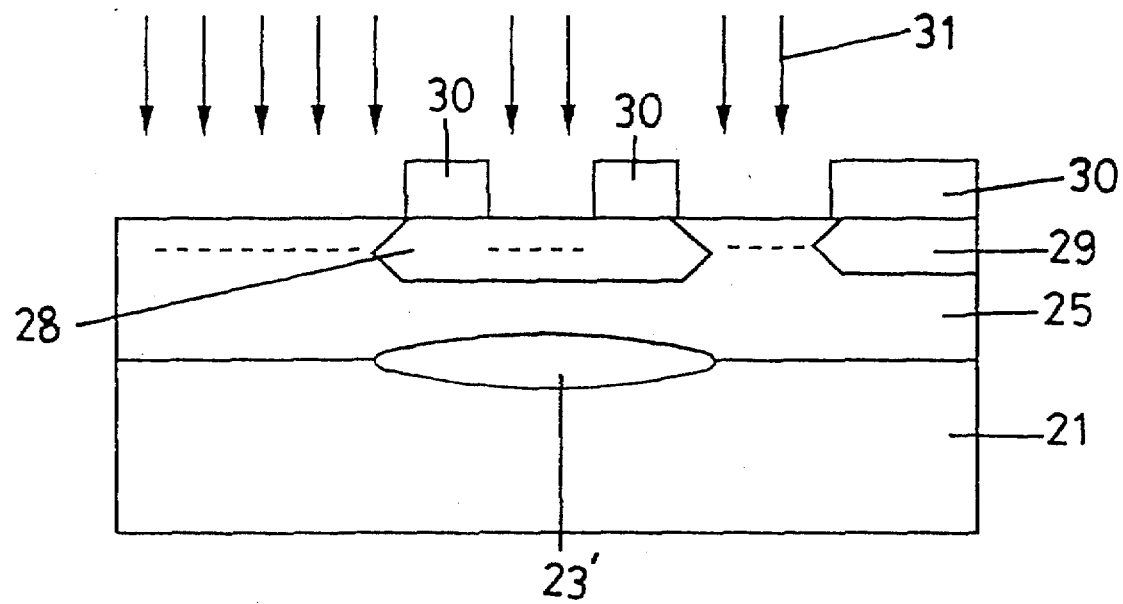
Figure 2F:
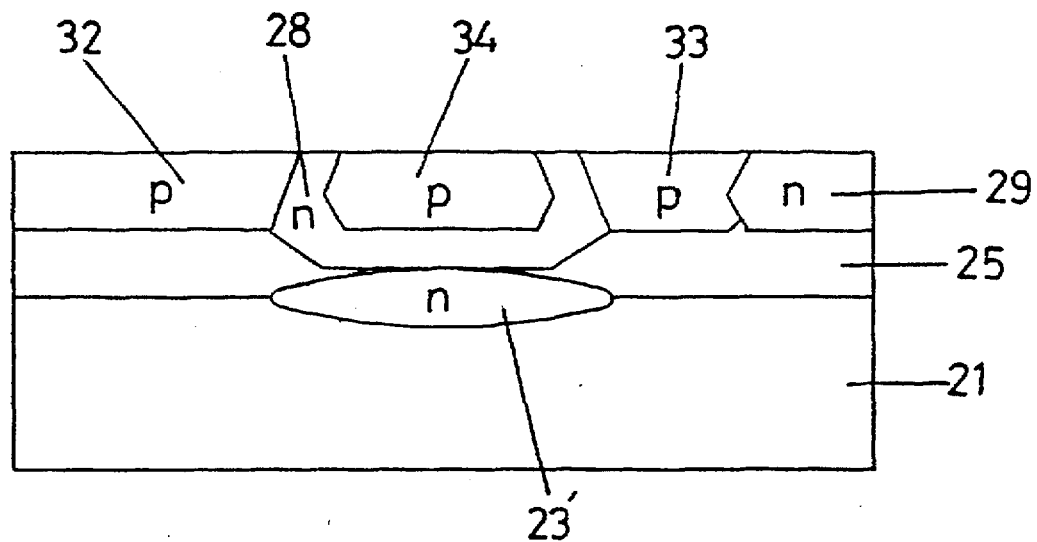

Referring to FIG. 2E, a photoresist mask 30 is formed on the epitaxial layer 25 above the first and second wells 28 and 29 through photolithography to expose a p-well region. P-type impurity ions such as boron B are ion-implanted (31) into the epitaxial layer 25 using the photoresist mask 30, and are thermally diffused to form p-wells 32 and 33 in the substrate and a p-well 34 in the second conductivity type first well 28, as shown in FIG. 2F. That is, the first conductivity well 34 is formed in the epitaxial layer 25 where the second conductivity type first well 28 is located and, at the same time, the first conductivity type well 32 and 33 are formed in the epitaxial layer 25 between the first and second wells 28 and 29. As a result, a triple-well is easily fabricated in the semiconductor substrate of a semiconductor device.

According to the present invention, any defects generated in the semiconductor substrate can be reduced because the high-energy ion implantation is not performed. Also, the n-shield region and n-wells are simultaneously formed, which simplifies the fabrication process. Further, a high-temperature thermal diffusion process need not be carried out for a long time, which decreases the time required for the fabrication process. Moreover, since the concentration of the lower portion of the n-shield region is high, the immunity to the latch-up and soft error is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming wells in a semiconductor device, the method comprising the steps of:

forming a second conductivity type impurity region in a first conductivity type semiconductor substrate;

forming an epitaxial layer on the semiconductor substrate;

forming a second conductivity type first well in a first portion of the epitaxial layer, and a second conductivity type second well in a second portion of the epitaxial layer; and forming a first conductivity type first well in the first portion of the epitaxial layer, and a first conductivity type second well in a portion of the epitaxial layer between the second conductivity type first and second wells.

2. The method of forming wells in a semiconductor device as claimed in claim 1, wherein the first conductivity type is an n-type, and the second conductivity type is a p-type.

3. The method of forming wells in a semiconductor device as claimed in claim 1, wherein the first conductivity type is a p-type, and the second conductivity type is an n-type.

4. The method of forming wells in a semiconductor device as claimed in claim 1, wherein the second conductivity type impurity region is formed through ion-implantation.

5. The method of forming wells in a semiconductor device as claimed in claim 1, wherein the first conductivity type first and second wells, and the second conductivity type first and second wells are formed through ion-implantation.

6. The method of forming wells in a semiconductor device as claimed in claim 1, wherein the step of forming a second conductivity type first well includes the step of:

simultaneously depositing ion impurities into the first and second portions of the epitaxial layer to form the second conductivity type first and second wells.

7. The method of forming wells in a semiconductor device as claimed in claim 1, wherein the second conductivity type first and second wells are formed through implantation of impurity ions, so that the second conductivity type first well contacts the second conductivity type impurity region when heat treatment is applied.

8. A method for forming wells in a semiconductor device, the method comprising the steps of:

forming a first mask pattern on a portion of a first conductivity type semiconductor substrate, and ion-implanting second conductivity type impurity ions using the first mask pattern to form a second conductivity type impurity region;

removing the first mask pattern and forming an epitaxial layer of a first conductivity type material on the semiconductor substrate;

forming a second mask pattern on the epitaxial layer, performing ion-implantation of second conductivity type impurity ions using the second mask pattern, applying heat thereto to form second conductivity type first and second wells, and removing the second mask pattern, whereby the second conductivity type first well is formed on the second conductivity type impurity region; and forming a third mask pattern on the epitaxial layer and ion-implanting first conductivity type impurity ions into the epitaxial layer using the third mask pattern to form first conductivity type first and second wells, whereby the first conductivity type first well is substantially surrounded by the second conductivity type first well, and the first conductivity type second well is formed between the second conductivity type first and second wells.

9. The method for forming wells in a semiconductor device as claimed in claim 8, wherein the first mask pattern is formed of an oxide layer.

10. The method for forming wells in a semiconductor device as claimed in claim 8, wherein the second and third mask patterns are formed of a photoresist.

11. The method for forming wells in a semiconductor device as claimed in claim 8, wherein the second conductivity type is an n-type, and the first conductivity type is a p-type.

12. The method for forming wells in a semiconductor device as claimed in claim 8, wherein the second conductivity type is a p-type, and the first conductivity type is an n-type.

13. The method for forming wells in a semiconductor device as claimed in claim 8, wherein the second conductivity type first and second wells are formed through ion-implantation of n-type impurities, and the first conductivity type first and second wells are formed through ion-implantation of p-type impurities.

14. The method for forming wells in a semiconductor device as claimed in claim 8, wherein the second conductivity type first and second wells are formed by implanting impurity ions to a certain depth, such that the second conductivity type first well contacts the second conductivity type impurity region when heat treatment is performed.

15. A method of forming wells in a semiconductor device, comprising the steps of:

forming a shield region of a first conductivity type in a substrate;

forming an epitaxial layer over the shield region and on the substrate;

forming first and second wells of a first conductivity type in first and second portions of the epitaxial layer, the first and second wells separated from each other by a third portion of the epitaxial layer; and forming a third well of a second conductivity type in the first well formed in the epitaxial layer.

16. A method of claim 15, wherein the step of forming first and second wells includes the step of:

simultaneously depositing ion impurities into the first and second portions of the epitaxial layer to form the first and second wells.

17. A method of claim 16, wherein the step of forming a shield region includes the steps of:

providing a semiconductor substrate of a second conductivity type, and forming the shield region in the semiconductor substrate.

18. A method of claim 15, wherein the first conductivity type is an n-type and the second conductivity type is a p-type.

19. The method of claim 15, wherein the first conductivity type is a p-type and the second conductivity type is an n-type.

20. The method of claim 15, further comprising the step of:

forming a fourth well of a second conductivity type in the third portion of the epitaxial layer.

21. The method of claim 20, further comprising the step of:

forming a fifth well of a second conductivity type in a fourth portion of the epitaxial layer, the third and fourth portions of the epitaxial layer being on opposite sides of the first well.

22. The method of claim 21, wherein in the steps of forming the third, fourth and fifth wells, the fourth, first, third and second portions of the epitaxial layer correspond to an upper portion of the epitaxial layer and are arranged in that order.

23. The method of claim 21, wherein in the steps of forming the third, fourth and fifth wells, impurities ions are deposited into the first well, the third portion and the fourth portion of the epitaxial layer.

* * * * *